(12) United States Patent
Chiu

(10) Patent No.: US 7,084,670 B1
(45) Date of Patent: Aug. 1, 2006

(54) PHASE-FREQUENCY DETECTOR WITH GATED REFERENCE CLOCK INPUT

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 21 days.

(21) Appl. No.: 10/881,879

(22) Filed: Jun. 30, 2004

(51) Int. Cl.
*G01R 25/00* (2006.01)

(52) U.S. Cl. .............................. 327/5; 327/8
(58) Field of Classification Search ............. None
See application file for complete search history.

(56) References Cited

U.S. PATENT DOCUMENTS

| | | | | |
|---|---|---|---|---|
| 5,727,038 A | * | 3/1998 | May et al. | 375/376 |
| 6,084,479 A | * | 7/2000 | Duffy et al. | 331/17 |
| 6,215,362 B1 | * | 4/2001 | Feng et al. | 331/17 |
| 6,310,521 B1 | * | 10/2001 | Dalmia | 331/11 |
| 6,642,747 B1 | | 11/2003 | Chiu | |
| 2002/0021368 A1 | * | 2/2002 | Uto | 348/540 |

\* cited by examiner

*Primary Examiner*—Timothy P. Callahan
*Assistant Examiner*—Cassandra Cox
(74) *Attorney, Agent, or Firm*—Darby & Darby PC; Matthew M. Gaffney

(57) ABSTRACT

A gated phase-frequency detector circuit includes a phase-frequency detector and a multiplexer circuit. The phase-frequency detector is arranged to provide UP and DOWN signals responsive to a reference clock signal and a feedback signal. Further, the phase-frequency detector includes a first flip-flop that provides the UP signal, a second flip-flop that provides the DOWN signal, and a clear logic circuit. One input of the multiplexer circuit is coupled to the output of the first flip-flop, another input of the multiplexer circuit is arranged to receive a logic high signal, and an output of the multiplexer circuit is coupled to the D input of the first flip-flop. The multiplexer circuit is arranged to multiplex the logic high signal and the UP signal responsive to a reference gate signal. If the reference gate signal corresponds to an active level, logic level of the UP signal does not change.

20 Claims, 5 Drawing Sheets

PHASE-FREQUENCY DETECTOR WITH GATED REFERENCE CLOCK INPUT

FIELD OF THE INVENTION

The invention is related to phase-locked loops, and in particular, to a phase-frequency detector with a gated reference clock input.

BACKGROUND OF THE INVENTION

Phase-locked loop (PLL) circuits are useful in many electronic systems. For example, PLL circuits may be used for master clock generation for a microprocessor system, clock generation for a sampling clock in an analog-to-digital conversion system, clock generation for data recovery in a low-voltage differential signal (LVDS) driver/receiver system, cathode ray tube (CRT) displays, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. Typically, a voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

A PLL circuit may include a PFD circuit that provides UP and DOWN signals in response to the comparison between the output clock signal and the reference clock signal. The UP and DOWN signals are dependent on both the phase and frequency of the output and reference clock signals. The UP signal is active when the frequency of the output clock signal is lower than the reference signal, while the DOWN signal is active when the frequency of the output clock signal is determined to be higher than the reference signal. Similarly, the UP signal is active when the phase of the output clock is lagging behind the phase of the reference clock, and the DOWN signal is active when the phase of the output clock is leading the phase of the reference clock.

BRIEF DESCRIPTION OF THE DRAWINGS

Non-limiting and non-exhaustive embodiments of the present invention are described with reference to the following drawings, in which.

DETAILED DESCRIPTION

Figure 1:
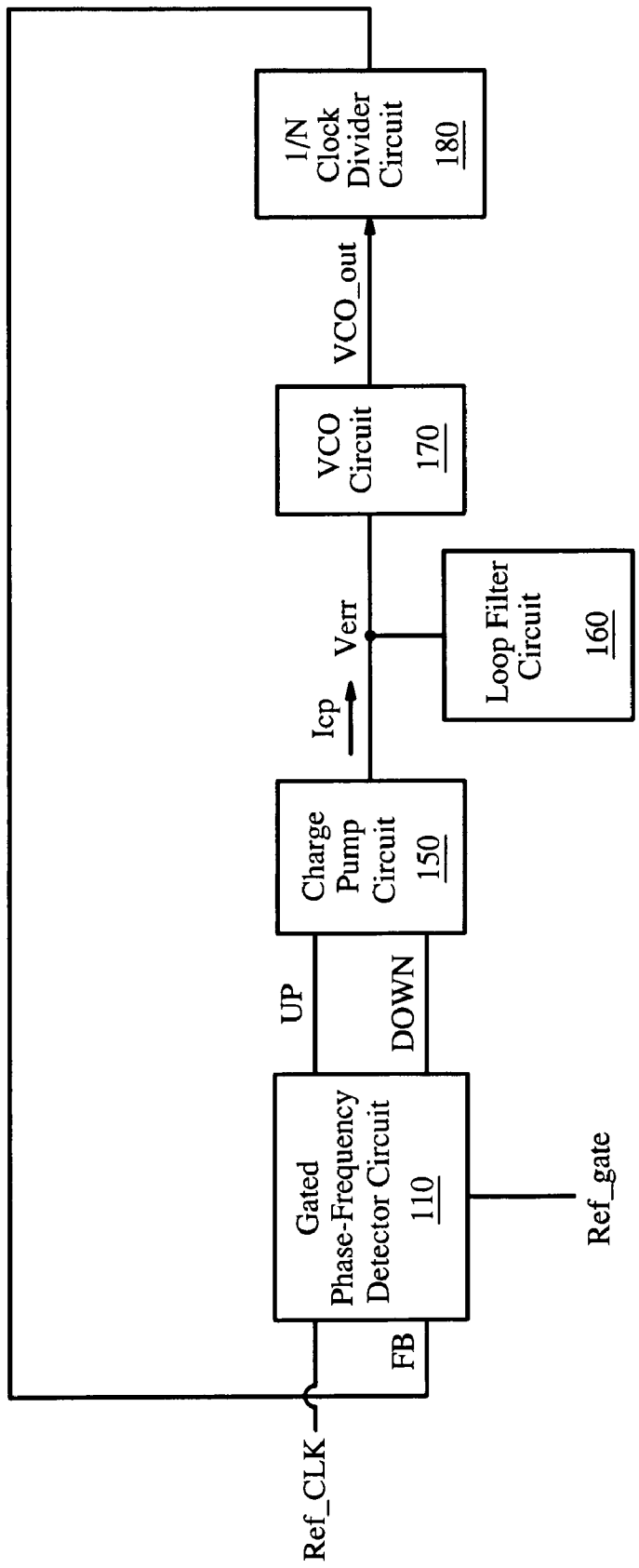
FIG. 1 illustrates a block diagram of an embodiment of a phase-locked loop circuit that includes an embodiment of a gated phase-frequency detector circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a gated phase-frequency detector circuit that includes a phase-frequency detector and a multiplexer circuit. The phase-frequency detector is arranged to provide UP and DOWN signals responsive to a reference clock signal and a feedback signal. Further, the phase-frequency detector includes a first flip-flop that provides the UP signal, a second flip-flop that provides the DOWN signal, and a clear logic circuit. One input of the multiplexer circuit is coupled to the output of the first flip-flop, another input of the multiplexer circuit is arranged to receive a logic high signal, and an output of the multiplexer circuit is coupled to the D input of the first flip-flop. The multiplexer circuit is arranged to multiplex the logic high signal and the UP signal responsive to a reference gate signal. If the reference gate signal corresponds to an active level, logic level of the UP signal does not change. If the reference gate signal corresponds to an active level, the gated phase-frequency detector circuit functions in substantially the same way as a conventional phase-frequency detector.

FIG. 1 illustrates a block diagram of an embodiment of PLL circuit 100, which includes an embodiment of a gated phase-frequency detector circuit. PLL circuit 100 includes gated phase-frequency detector circuit 110, charge pump circuit 150, loop filter circuit 160, VCO circuit 170, and 1/N clock divider circuit 180.

Gated phase-frequency detector circuit 110 may be arranged to provide signals UP and DOWN based, in part, on reference clock signal Ref_CLK, feedback signal FB, and reference gate signal Ref_gate.

Further, gated phase-frequency detector circuit 110 may be arranged such that, if signal Ref_gate corresponds to an active logic level, gated phase-frequency circuit 110 provides signals UP and DOWN in substantially the same manner as a phase-frequency detector. However, gated phase-frequency detector circuit 110 is further arranged such that, if signal Ref_gate corresponds to an inactive logic level, a logic level that is associated with signal UP remains the same, regardless of signal Ref_CLK.

In one embodiment, a flip-flop (not shown in FIG. 1) in gated phase-frequency detector circuit 110 is triggered on the rising edges of signal Ref_CLK if signal Ref_gate corresponds to an active logic level. In this embodiment, if signal Ref_gate corresponds to an inactive logic level, rising edges of signal Ref_CLK are ignored.

In another embodiment, a flip-flop (not shown in FIG. 1) in gated phase-frequency detector circuit 110 is triggered on the falling edges of signal Ref_CLK if signal Ref_gate corresponds to an active logic level. In this embodiment, if signal Ref_gate corresponds to an inactive logic level, falling edges of signal Ref_CLK are ignored.

Also, charge pump circuit 150 is configured to provide charge pump current Icp responsive to signals UP and DOWN. Loop filter circuit 160 is arranged to provide error signal Verr in response to current Icp. VCO circuit 170 is arranged to provide oscillator output signal VCO_out from signal Verr. Further, 1/N clock divider circuit 180 is arranged to provide signal FB by dividing a frequency that is associated with signal VCO_out.

Figure 2:
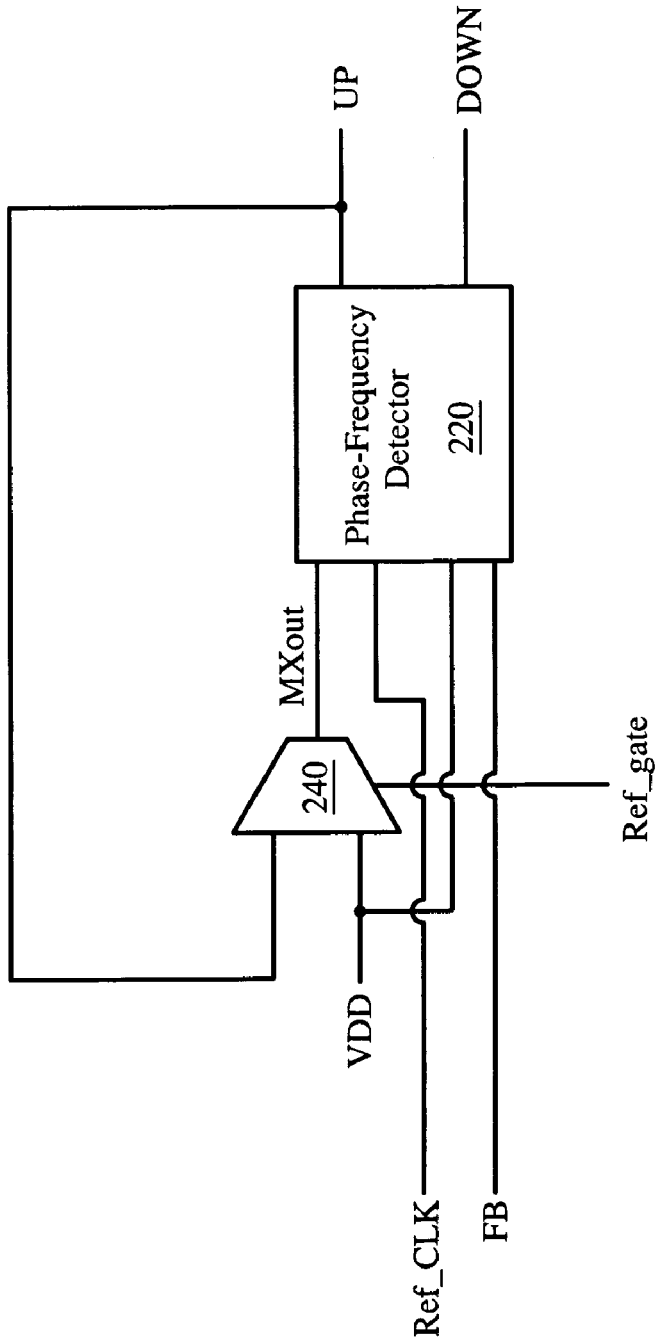
FIG. 2 shows a block diagram of an embodiment of a gated phase-frequency detector circuit.

FIG. 2 shows a block diagram of an embodiment of gated phase-frequency detector circuit 210. Gated phase-frequency detector circuit 210 may operate in a substantially similar manner to gated phase-frequency detector circuit 110 of FIG. 1, and may operate in a different manner in some ways. Gated phase-frequency detector circuit 210 includes multiplexer circuit 240 and phase-frequency detector (PFD) 220.

PFD 220 may be arranged to provide signals UP and DOWN at up and down outputs respectively of PFD 220 based, in part, on the phases and frequencies of signals Ref_CLK and FB. PFD 220 may be arranged to receive: signal MXout at a first detector input, signal VDD at a second detector input, signal Ref_CLK at a reference input, and signal FB at a feedback input.

Multiplexer circuit 240 may be arranged to receive signal UP at a first multiplexer input, to receive signal VDD at a second multiplexer input, and to receive signal Ref_gate at a select multiplexer input. Also, multiplexer circuit 240 may be arranged to provide multiplexer output signal MXout at a multiplexer output of multiplexer circuit 240 by multiplexing signals UP and VDD based on signal Ref_gate. Accordingly, multiplexer circuit 240 may be arranged to provide signal MXout such that signal MXout corresponds to a logic high if signal Ref_gate corresponds to an active logic level, and such that signal MXout corresponds to a logic level that is associated with signal UP if signal Ref_gate corresponds to an inactive logic level.

Although multiplexer circuit 240 is shown as receiving signal VDD, multiplexer circuit 240 may instead receive virtually any signal that provides a logic "high" instead of VDD. Also, in other embodiment, multiplexer 240 may instead receive virtually any signal that receives a logic "low".

Figure 3:
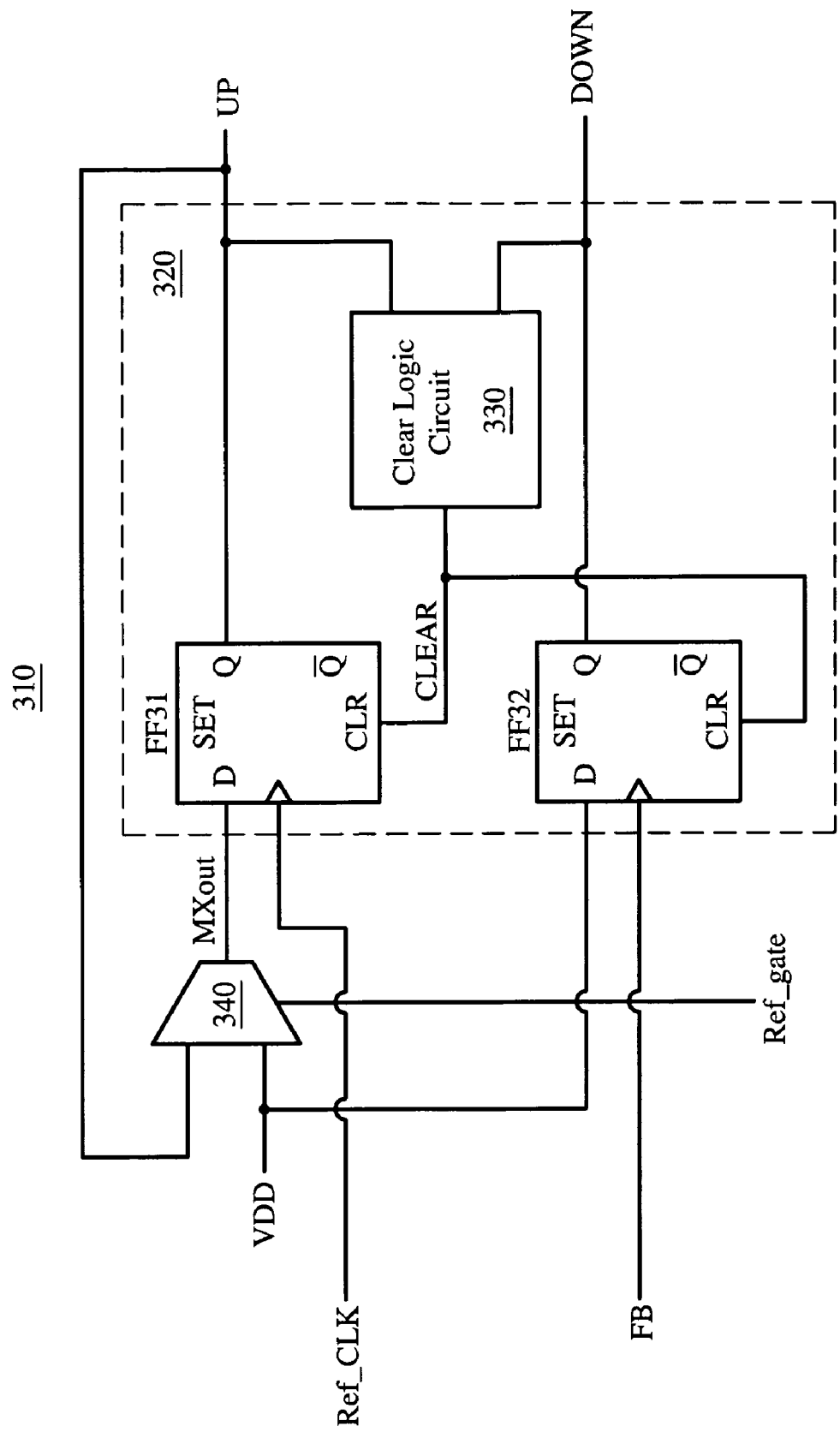
FIG. 3 illustrates a block diagram of an embodiment of the gated phase-frequency detector circuit of FIG. 2 in which an embodiment of the phase-frequency detector of FIG. 2 is shown.

FIG. 3 illustrates a block diagram of an embodiment of gated phase-frequency detector circuit 310, in which an embodiment of a PFD is shown. Components in gated phase-frequency detector circuit 310 may operate in a substantially similar manner to similarly-named components in gated phase-frequency detector circuit 210 of FIG. 2, and may operate in a different manner in some ways. PFD 320 includes flip-flops FF31 and FF32, and clear logic circuit 330.

Flip-flop FF31 may be arranged to receive signal MXout at a D input, to receive signal Ref_CLK at a clock input, to receive signal CLEAR at a clear input, and to provide signal UP at a Q output. Also, flip-flop FF32 may be arranged to receive signal VDD at a D input, to receive signal FB at a clock input, to receive signal CLEAR at a clear input, and to provide signal DOWN at a Q output. Clear logic circuit 330 is arranged to provide signal CLEAR based, in part, on signals UP and DOWN.

Clear logic circuit 330 may be arranged to provide signal CLEAR by employing an AND function on signals UP and DOWN. Accordingly, clear logic circuit 330 may be arranged to provide signal CLEAR such that the signals UP and DOWN are reset if signals UP and DOWN both correspond to a high logic level.

In other embodiments, complementary logic may be employed such that clear logic circuit provides a NOR function on signals UP and DOWN such that signals UP and DOWN are reset if signal UP and DOWN both correspond to a low logic level.

Although D flip-flops are illustrated in FIG. 3, types of memory circuits other than D flip-flops may be employed in PFD 320, such as SR flip-flops, JK flip-flops, T flip-flops, latches, and the like.

Figure 4:
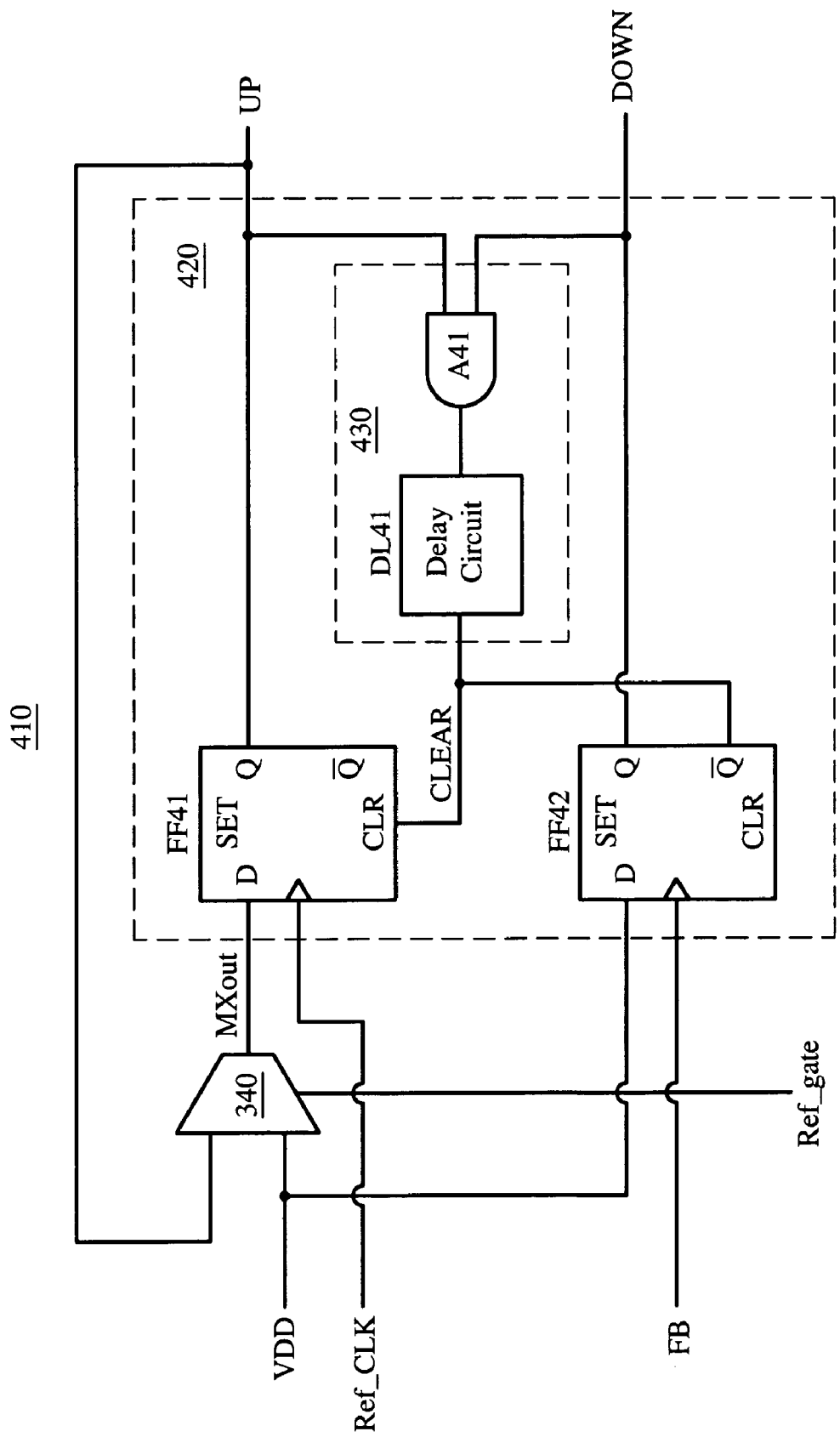
FIG. 4 shows a block diagram of an embodiment of the gated phase-frequency detector circuit of FIG. 3 in which an embodiment of the clear logic circuit of FIG. 3 is shown.

FIG. 4 shows a block diagram of an embodiment of gated phase-frequency detector circuit 410, in which an embodiment of a clear logic circuit is shown. Components in gated phase-frequency detector circuit 410 may operate in a substantially similar manner to similarly-named components in gated phase-frequency detector circuit 310 of FIG. 3, and may operate in a different manner in some ways. Clear logic circuit 430 includes AND gate A41 and delay circuit D41.

Figure 5:
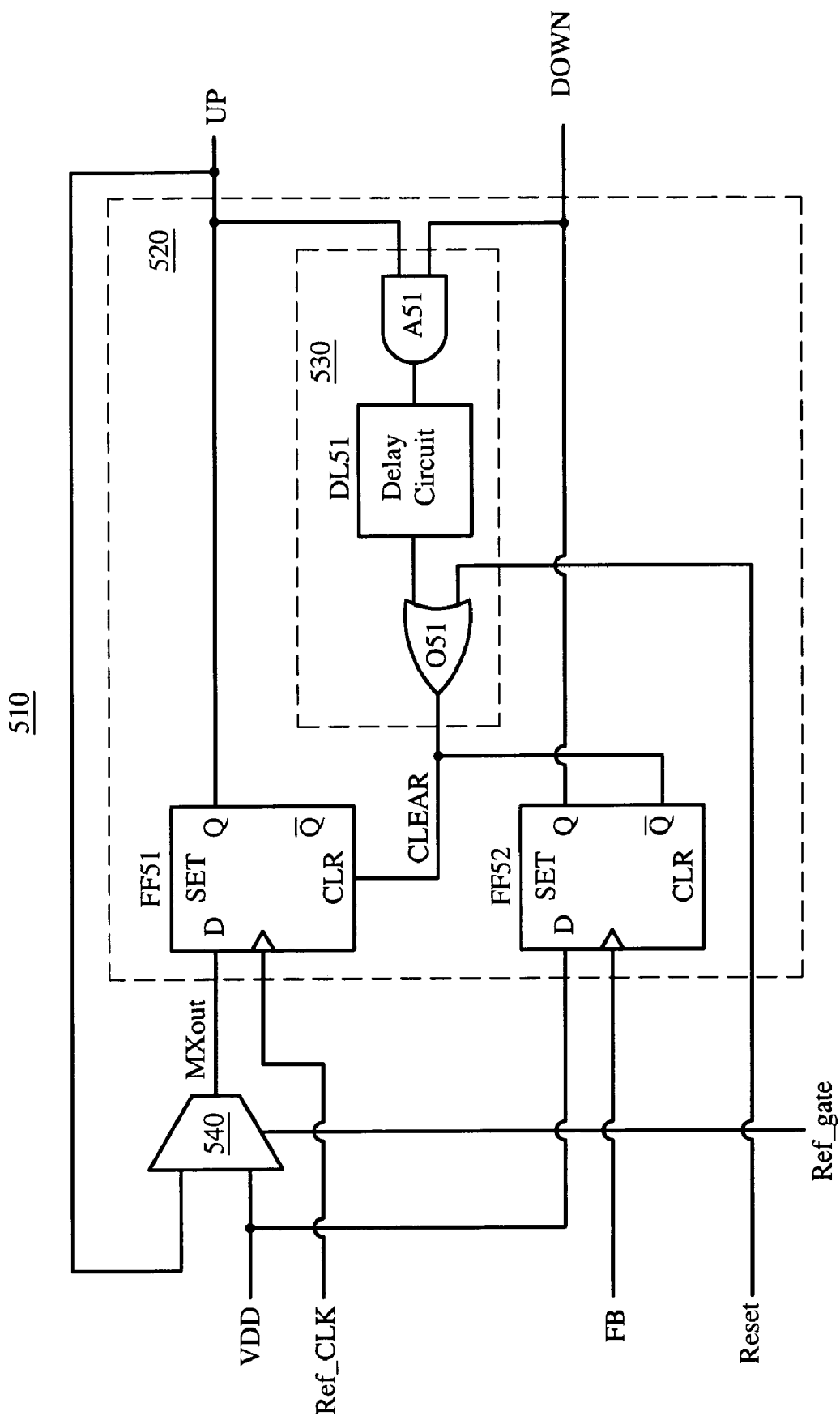
FIG. 5 illustrates a block diagram of an embodiment of the gated phase-frequency detector circuit of FIG. 3 in which another embodiment of the clear logic circuit of FIG. 3 is shown, arranged in accordance with aspects of the invention.

FIG. 5 illustrates a block diagram of an embodiment of gated phase-frequency detector circuit 510, in which another embodiment of a clear logic circuit is shown. Components in gated phase-frequency detector circuit 510 may operate in a substantially similar manner to similarly-named components in gated phase-frequency detector circuit 310 of FIG. 3, and may operate in a different manner in some ways. Clear logic circuit 530 includes AND gate A51, delay circuit D51, and OR gate 051.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for phase-frequency detection, comprising:
a phase-frequency detector that includes first and second detector inputs, a reference input, a feedback input, an up output, and a down output; and
a multiplexer circuit including first and second multiplexer inputs, a select multiplexer input, and a multiplexer output, wherein the first multiplexer input is coupled to the up output, and wherein the multiplexer output is coupled to the first detector input.

2. The circuit of claim 1, wherein the phase-frequency detector is arranged to receive a reference clock signal at the reference input, to receive a feedback clock signal at the feedback input, to provide an up signal at the up output, and to provide a down signal at the down output.

3. The circuit of claim 2, wherein the multiplexer circuit is arranged receive a reference gate signal at the select multiplexer input.

4. The circuit of claim 3, wherein the multiplexer circuit is further arranged to receive a logic high signal at the first multiplexer input.

5. The circuit of claim 4, wherein the multiplexer circuit is further arranged to provide a multiplexer output signal at the multiplexer output such that the multiplexer output signal corresponds to a logic high if the reference gate signal corresponds to an active logic level, and such that the multiplexer output level corresponds to a logic level that is associated with the up signal if the reference gate signal corresponds to an inactive logic level.

6. The circuit of claim 2, wherein the phase-frequency detector includes:
a first flip-flop including a first data input that is coupled to the multiplexer output, a first clock input that is arranged to receive the reference clock signal, a first clear input, and a first flip-flop output, wherein the first flip-flop is arranged to provide the up signal at the first flip-flop output;
a second flip-flop including a second data input that is arranged to receive the logic high signal, a second clock input that is arranged to receive the feedback clock signal, a second clear input, and a second flip-flop output, wherein the second flip-flop is arranged to provide the down signal at the second flip-flop output; and
a clear logic circuit that is arranged to provide a clear signal to the first and second clear inputs in response to the up and down signals.

7. The circuit of claim 6, where the clear logic circuit is arranged to provide the clear signal by performing an AND function on up and down signals.

8. The circuit of claim 6, wherein the clear logic circuit is arranged to provide the clear signal such that the up and down signals are reset if the up and down signals both correspond to a high logic level.

9. A circuit for phase-frequency detection, comprising:
a phase-frequency detector that is arranged to provide up and down signals based, in part, on a reference clock signal and a feedback clock signal; and
a multiplexer circuit that is coupled to the phase-frequency detector, wherein the multiplexer circuit is arranged to receive a reference gate signal, and further arranged such that a logic level that is associated with the up signal remains the same while the reference gate signal corresponds to an inactive logic level.

10. The circuit of claim 9, wherein the multiplexer circuit includes a first and second multiplexer inputs and a multiplexer output, and wherein the multiplexer circuit is arranged to receive the up signal at the first multiplexer input.

11. A circuit for phase-frequency detection, comprising:
a phase-frequency detector that is arranged to provide up and down signals based, in part, on a reference clock signal and a feedback clock signal; and
a multiplexer circuit that is coupled to the phase-frequency detector, wherein the multiplexer circuit is arranged to receive a reference gate signal, and further arranged such that a logic level that is associated with the up signal remains the same if the reference gate signal corresponds to an inactive logic level, wherein the multiplexer circuit includes a first and second multiplexer inputs and a multiplexer output, the multiplexer circuit is arranged to receive the up signal at the first multiplexer input, and wherein the phase-frequency detector includes a first detector input that is coupled to multiplexer output.

12. The circuit of claim 11, wherein the multiplexer circuit is arranged to receive a logic high signal at the first multiplexer input; and to provide a multiplexer output signal at the multiplexer output such that the multiplexer output signal corresponds to a logic high if the reference gate signal corresponds to an active logic level, and such that the multiplexer output level corresponds to a logic level that is associated with the up signal if the reference gate signal corresponds to an inactive logic level.

13. A circuit for phase-frequency detection, comprising:
a phase-frequency detector that is arranged to provide up and down signals based, in part, on a reference clock signal and a feedback clock signal; and
a multiplexer circuit that is coupled to the phase-frequency detector, wherein the multiplexer circuit is arranged to receive a reference gate signal, and further arranged such that a logic level that is associated with the up signal remains the same if the reference gate signal corresponds to an inactive logic level, where the phase-frequency detector includes:
a first flip-flop including a first data input that is coupled to the multiplexer, a first clock input that is arranged to receive the reference clock signal, a first clear input, and a first flip-flop output, wherein the first flip-flop is arranged to provide the up signal at the first flip-flop output;
a second flip-flop including a second data input, a second clock input that is arranged to receive the feedback clock signal, a second clear input, and a second flip-flop output, wherein the second flip-flop is arranged to provide the down signal at the second flip-flop output; and
a clear logic circuit that is arranged to provide a clear signal to the first and second clear inputs in response to the up and down signals.

14. The circuit of claim 13, where the clear logic circuit is arranged to provide the clear signal by performing an AND function on up and down signals.

15. The circuit of claim 13, wherein the clear logic circuit is arranged to provide the clear signal such that the up and down signals are reset if the up and down signals both correspond to a high logic level.

16. The circuit of claim 13, wherein the multiplexer circuit includes first and second multiplexer inputs and a multiplexer output, wherein the first data input is coupled to the multiplexer output.

17. The circuit of claim 16, wherein the first multiplexer circuit is arranged to receive the up signal at the first multiplexer input.

18. The circuit of claim 17, wherein the first multiplexer circuit is arranged to receive a logic high signal at the second multiplexer input.

19. The circuit of claim 18, wherein the multiplexer circuit is arranged to provide a multiplexer output signal at the multiplexer output such that the multiplexer output signal corresponds to a logic high if the reference gate signal corresponds to an active logic level, and such that the multiplexer output level corresponds to a logic level that is associated with the up signal if the reference gate signal corresponds to an inactive logic level.

20. An apparatus for phase-frequency detection, comprising:
means for providing up and down signals based, in part, on a phase of a reference clock signal, a frequency of the reference clock signal, a phase of a feedback clock signal, and a frequency of the feedback clock signal; and
means for causing a logic level that is associated with the up signal to remain the same while a reference gate signal corresponds to a first logic level.

\* \* \* \* \*